(12) United States Patent
Mauritz et al.

(10) Patent No.: US 6,624,718 B2
(45) Date of Patent: Sep. 23, 2003

(54) SIGNAL TRANSMISSION UNIT

(75) Inventors: Karl H. Mauritz, Chandler, AZ (US); David W. Frame, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/736,804

(22) Filed: Dec. 14, 2000

(65) Prior Publication Data

US 2002/0075093 A1 Jun. 20, 2002

(51) Int. Cl.$^7$ ................................ H01P 3/08; H01P 5/00
(52) U.S. Cl. ...................... 333/34; 333/246; 333/263
(58) Field of Search ........................ 333/33, 34, 21 R, 333/246, 263; 326/10

(56) References Cited

U.S. PATENT DOCUMENTS

| | | | |
|---|---|---|---|
| 4,283,694 A | | 8/1981 | Pauker .................... 333/34 |
| 4,730,172 A | * | 3/1988 | Bengeult .................. 333/26 |
| 4,835,496 A | * | 5/1989 | Schellenberg et al. ...... 330/286 |
| 5,119,048 A | | 6/1992 | Grunwell .................... 333/34 |
| 5,352,994 A | * | 10/1994 | Black et al. ................ 333/33 |
| 5,471,162 A | * | 11/1995 | McEwan .................. 327/251 |
| 5,576,671 A | * | 11/1996 | Agar et al. ................ 330/295 |
| 5,691,566 A | | 11/1997 | Sturdivant ................ 257/664 |
| 5,945,890 A | * | 8/1999 | McCorkle ................ 333/128 |

OTHER PUBLICATIONS

R.W. Klopfenstein "A Transmission Line Taper of Improved Design" 44 Proc. IRE pp. 31–35 (Jan. 1956).*

* cited by examiner

Primary Examiner—Robert Pascal
Assistant Examiner—Joseph Chang
(74) Attorney, Agent, or Firm—Schwegman, Lundberg, Woessner & Kluth, P.A.

(57) ABSTRACT

A signal transmission unit includes a first transmission line, a second transmission line, and a tapered transmission line coupling the first transmission line to the second transmission line. The tapered transmission line has a width and a length and the width changes along the length according to one or more functions. The one or more functions include but are not limited to linear functions, non-linear functions, hyperbolic functions, and exponential functions.

16 Claims, 6 Drawing Sheets

SIGNAL TRANSMISSION UNIT

FIELD

This invention relates to the transmission of electronic signals, and more particularly, to the transmission of electronic signals between transmission lines having different characteristic impedances.

BACKGROUND

In modern electronic systems, signals are often transmitted on transmission lines having different characteristic impedances. For example, when a processor mounted on a printed circuit board sends an electronic signal to a memory module mounted on the printed circuit board, the signal may travel on the circuit board over a transmission line having a characteristic impedance of 50 ohms, and on the memory module over a transmission line having a characteristic impedance of 28 ohms.

When transmission lines having different characteristic impedances are connected together in an electronic system there is an impedance mismatch at the point where the transmission lines are connected. When an electronic signal traveling along a transmission line encounters an impedance mismatch, the electronic signal may be reflected back along the transmission line. At low data rates, and as long as reflections die out before another signal is transmitted, reflected signals generally do not adversely affect the operation of the system. However, at high data rates, reflected signals can cause an electronic system to operate unpredictably or to fail.

Several methods are available for reducing reflections on coupled transmission lines in electronic systems. The methods are generally divided into active methods and passive methods. In the active methods, an active device, such as a transistor, is inserted between two transmission lines that have different characteristic impedances. The impedance of the input port of the transistor is designed to be about equal to the characteristic impedance of the transmission line to which the transistor is attached. Signals that arrive at the input port of the transistor are not reflected because the impedance of input port of the transistor matches the characteristic impedance of the transmission line. Active devices can be designed to match most transmission line impedances. In the passive methods, a passive device, such as a transformer, is inserted between two transmission lines that have different characteristic impedances. The impedance of the input port of the transformer is designed to be about equal to the characteristic impedance of the transmission line to which the input port of the transformed is attached. Passive devices can be designed to match many transmission line impedances.

Unfortunately, both passive and active impedance matching methods have disadvantages. Active devices consume power and take up a large amount of surface area on a printed circuit board or other substrate. Passive devices also take up a larger amount of surface area on a printed circuit board or other substrate. Both passive and active devices are expensive because they require mounting additional components on a printed circuit board or other substrate. In addition, both active and passive methods are relatively unreliable because they usually require soldering to couple the devices to a circuit board and to couple to the devices to the transmission lines. Solder joints usually have a high failure rate when compared to the failure rates of electronic components.

For these and other reasons there is a need for the present invention.

DESCRIPTION

Figure 1A:
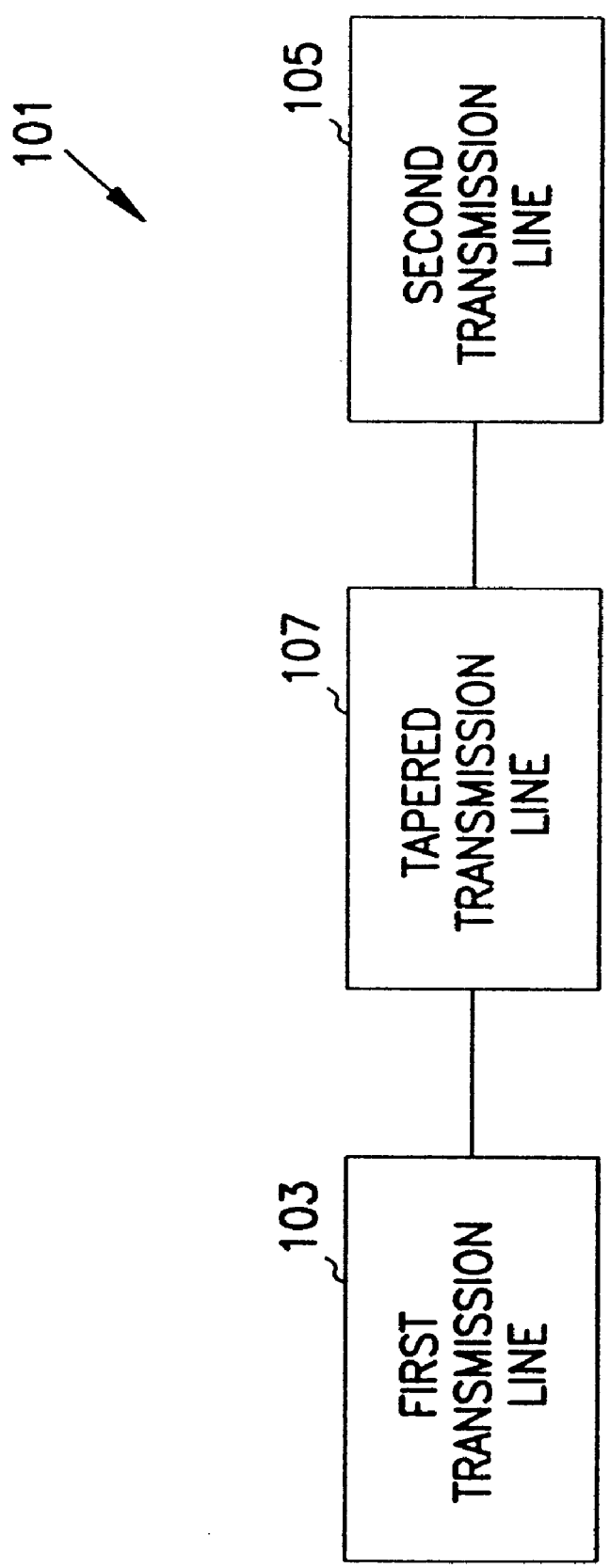
FIG. 1A is a block diagram of one embodiment of a signal transmission unit according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a block diagram of one embodiment of a signal transmission unit 101 according to the teachings of the present invention. The signal transmission unit 101 includes a first transmission line 103, a second transmission line 105, and a tapered transmission line 107. The tapered transmission line 107 is located between the first transmission line 103 and the second transmission line 105 and couples the first transmission line 103 to the second transmission line 105. A tapered transmission line, such as tapered transmission line 107, is a transmission line in which the width of the transmission line changes along the length of the transmission line. The width may change along the length according to one or more functions, such as linear, hyperbolic, or exponential functions. Preferably, the width (and the function or functions by which the width changes along the length) of the tapered transmission line 107 and the length of the tapered transmission line 107 are selected to substantially eliminate signal reflections for signals transmitted from the first transmission line 103 to the second transmission line 105 or from the second transmission line 105 to the first transmission line 103.

The transmission lines 103, 105, and 107 are not limited to a particular type of transmission lines. In one embodiment, at least one of the transmission lines 103, 105, and 107 is a microstrip transmission line. A microstrip transmission line includes a conductor separated from a conductive plane by a dielectric. In an alternate embodiment at least one of the transmission lines 103, 105, and 107 is a stripline transmission line. A stripline transmission line includes a conductor separated from a first conductive plane by a first dielectric and separated from a second conductive plane by a second dielectric.

Figure 1B:
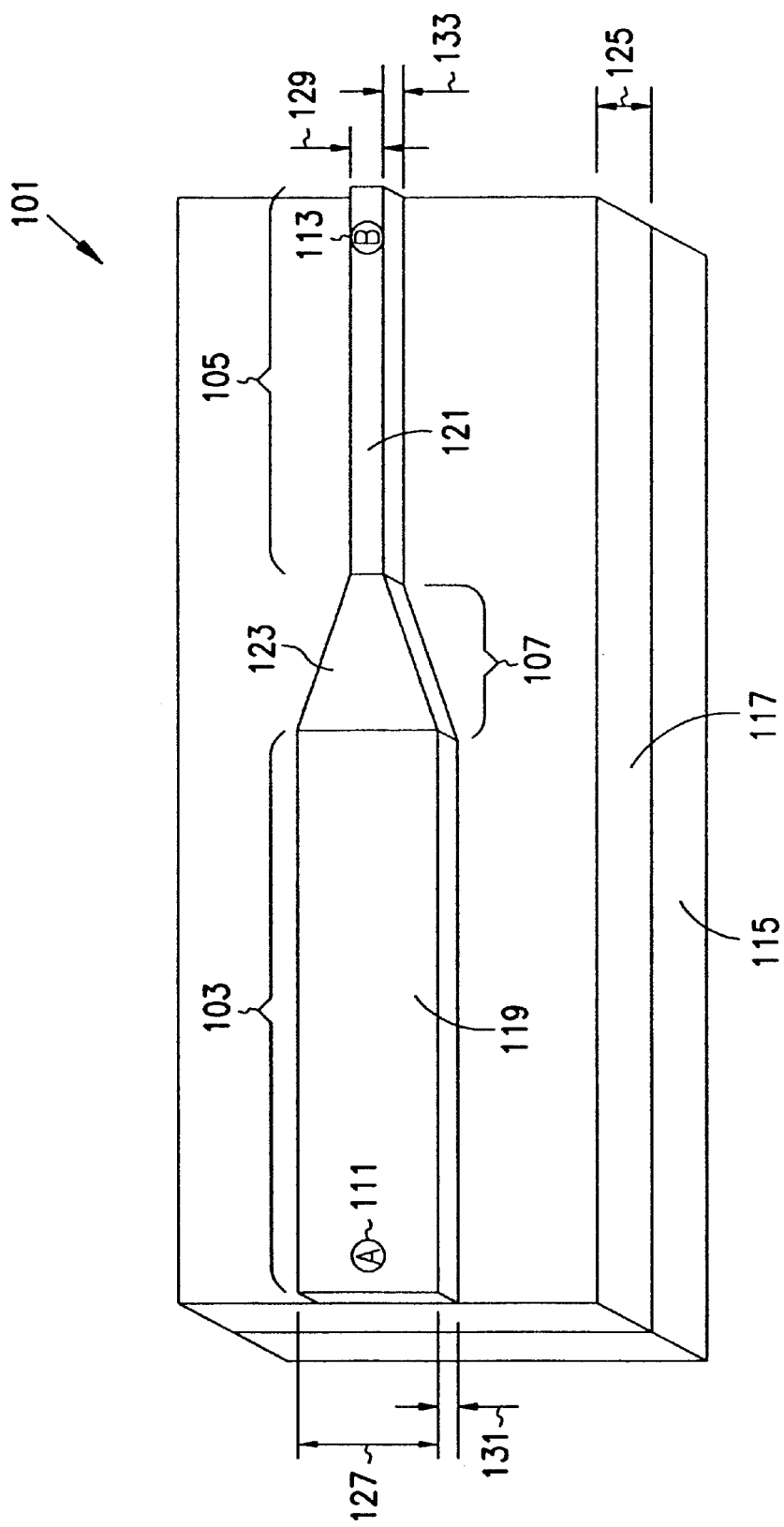
FIG. 1B is a perspective view of one embodiment of a signal transmission unit according to the teachings of the present invention.

FIG. 1B is a perspective view of one embodiment of a signal transmission unit 101 according to the teachings of the present invention. The signal transmission unit 101 includes a first transmission line 103, a second transmission line 105, and a tapered transmission line 107. The tapered transmission line 107 is located between the first transmission line 103 and the second transmission line 105 and couples the first transmission line 103 to the second transmission line 105. The signal transmission unit 101 provides an interconnect for conveying electromagnetic radiation from point A 111 to point B 113 without reflections or from point B113 to point A111.

The transmission lines 103, 105, and 107 include a conductive layer 115, a dielectric layer 117, and conductors 119, 121, and 123 separated from the conductive layer 115 by the dielectric layer 117. The dielectric layer 117 has a thickness 125. The conductors 119 and 121 have widths 127 and 129, respectively. The conductor 119 has a thickness 131 and the conductor 121 has a thickness 133.

The conductive layer 115 provides a conductive plane for the propagation of electromagnetic waves in each of the transmission lines 103, 105, and 107. The conductive layer 115 is preferably fabricated from a conductive material, such as a metal. Exemplary metals suitable use in the fabrication of conductive layer 115 include copper, gold, silver, aluminum, or an alloy of copper, gold, silver, or aluminum.

The dielectric layer 117 provides a medium for the propagation of electromagnetic radiation in the transmission lines 103, 105, and 107. The dielectric layer 117 is not limited to being fabricated from a particular dielectric material. Any dielectric material suitable for use in connection with the fabrication of microstrip or stripline interconnects is suitable for use in the fabrication of the dielectric layer 117. Exemplary dielectrics suitable for use in the fabrication of the dielectric layer 117 include plastics, glasses, ceramics, semiconductors, and epoxies.

Some dielectric materials can be formulated to have a specific dielectric constant. For example, if a dielectric can be formulated to have a dielectric constant between about 2.0 and about 15 or higher, then when using such a dielectric material for the dielectric layer 117, the dielectric layer 117 is preferably fabricated to have the dielectric constant of about 3.6.

The conductor 119 is fabricated from a conductive material, such as a metal. Exemplary metals suitable for use in the fabrication of the conductor 119 include copper, aluminum, gold, silver, and alloys of copper aluminum, gold and silver.

The characteristic impedance of the first transmission line 103 is controlled by the selection of the thickness 125 of the dielectric layer 117, the dielectric constant of the dielectric layer 117, and the width 127 of the conductor 119. The process for selecting the thickness 125 of the dielectric layer 117 and the width 127 and the thickness 131 of the conductor 119 to produce a particular characteristic impedance in the first transmission line 103 is known to those skilled in the art. The characteristic impedance of the first transmission line 103 is generally selected to match the output/input impedance of a signal source (not shown) or destination (not shown) that drives or sources the transmission line 103. For example, if a transistor having an output impedance of 50 ohms is selected to drive the first transmission line 103, then the characteristic impedance of the transmission line 105 is selected to be about 50 ohms.

The conductor 121 is fabricated from a conductive material, such as a metal. Exemplary metals suitable for use in the fabrication of the conductor 121 include copper, aluminum, gold, silver, and alloys of copper aluminum, gold, and silver.

The characteristic impedance of the second transmission line 121 is controlled by the selection of the thickness 125 of the dielectric layer 117, the dielectric constant of the dielectric layer 117, and the width 129 and thickness 133 of the conductor 121. The process for selecting the thickness 125 of the dielectric layer 117 and the width 129 of the conductor 121 to produce a particular characteristic impedance in the second transmission line 105 is known to those skilled in the art. The characteristic impedance of the second transmission line 105 is generally selected to be about equal to the impedance of a receiver/driver (not shown) that is coupled to the second transmission line 105. For example, if a transistor having an input impedance of 28 ohms is selected as a receiver for the second transmission line 105, then the characteristic impedance of the second transmission line 103 is selected to be about 28 ohms.

Figure 2A:
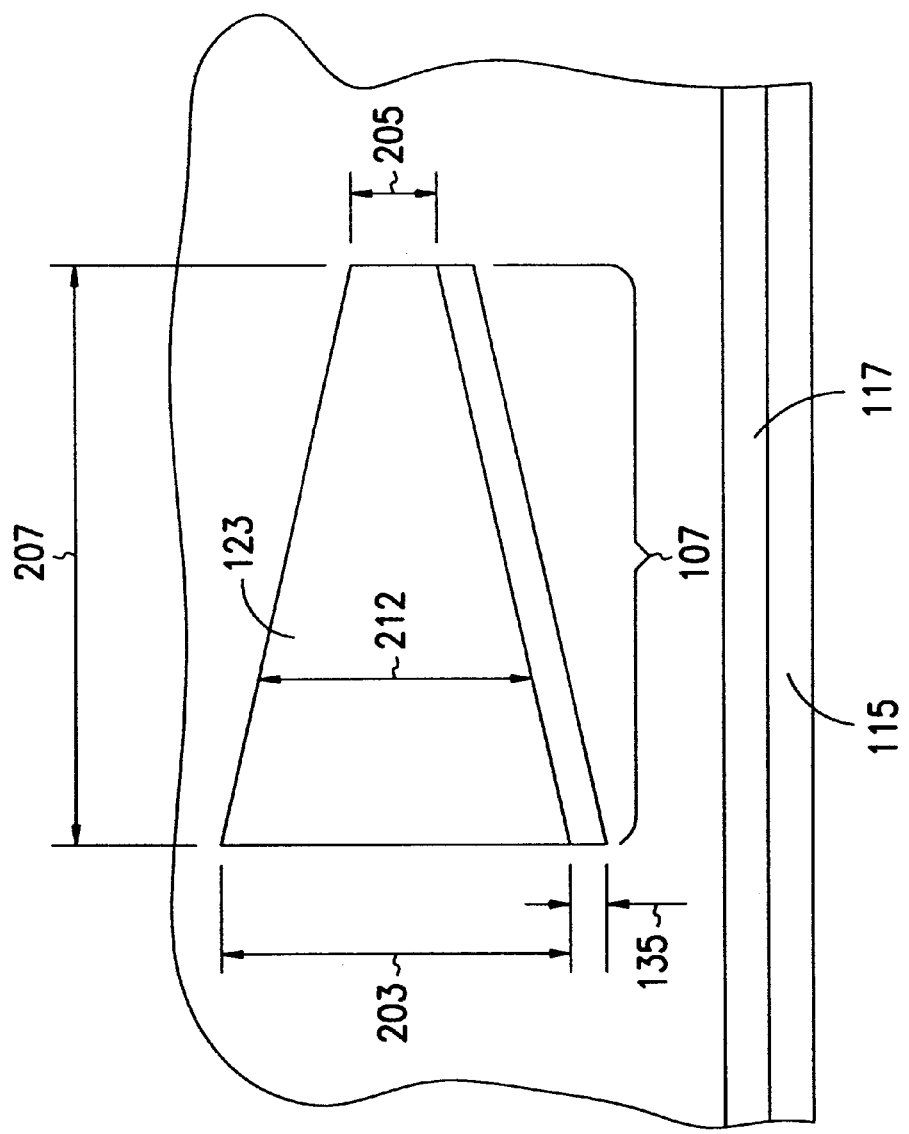
FIG. 2A is a magnified view of the tapered transmission line shown in FIG. 1B.

FIG. 2A is a magnified view of the tapered transmission line 107 shown in FIG. 1A and FIG. 1B. The conductor 123 is fabricated from a conductive material, such as a metal. Exemplary metals suitable for use in the fabrication of the conductor 123 include copper, aluminum, gold, silver, and alloys of copper, aluminum, gold and silver. The conductor 123 has a thickness 135, a first width 203, a second width 205, a length 207, and a width 212 that can change along the length 207. Referring to FIG. 1B and FIG. 2A, the first width 203 is selected to be substantially equal to the width 127 of the conductor 119. The second width 205 is selected to be substantially equal to the width 129 of the conductor 121. The length 207 and the width 212 of the conductor 123 are selected to avoid signal reflections on the first transmission line 103 for a signal traveling along the signal transmission unit 101 from the point A 111 to the point B 113 or from the point B 113 to the point A 111. In one embodiment, the width 212 changes along the length 207 according to one or more functions. Each of the one or more functions is preferably piecewise linear, but the width 212 is not limited to changing along the length 207 according to a particular function or functions. In one embodiment, the width 212 changes along the length 207 according to a hyperbolic function. In another embodiment, the width 212 changes along the length 207 according to a linear function. In still another embodiment, the width 212 changes along the length 207 according to an exponential function. In yet another embodiment, the width 212 changes along the length 207 according to a linear function and a hyperbolic function.

Still referring to FIG. 1B and FIG. 2A, those skilled in the art will appreciate that the impedance along the tapered transmission line 107 will change as the width 212 changes, and that the width 212 can be calculated at any point along the tapered transmission line 107 from the impedance. For example, to calculate the impedance, the characteristic impedance of the first transmission line 103 and the characteristic impedance of the second transmission line 105 are fit to the selected function—linear, hyperbolic, exponential, or other function. The width 212 at a particular point along the length 207 is then calculated by first calculating an impedance at the particular point according to the fitted selected function and then multiplying the ratio of the impedance to the characteristic impedance of the second transmission line 105 by the width of the second transmission line 105. In this way, the width 212 can be calculated at any point along the length 207 of the tapered transmission line 107.

Referring again to FIG. 1B, for the dielectric layer 117 fabricated from a material other than free space, the conductors 119, 121, and 123 can be formed on the dielectric layer 117 by any method suitable for use in the fabrication of electronic conductors on a substrate. In one embodiment, for the dielectric layer 117 being fabricated from a glass-epoxy, the conductors 119, 121, and 123 are formed by patterning and etching a conductive layer formed on the surface of the glass-epoxy. In an alternate embodiment, for the dielectric layer 117 being fabricated from a semiconductor, the conductors 119, 121, and 123 are formed on the semiconductor by patterning and etching a conductive layer formed on the surface of the semiconductor. In still another alternate embodiment, for the dielectric layer 117 being fabricated from a ceramic material, the conductors 119, 121, and 123 are formed on the ceramic material by patterning and etching a conductive layer formed on the surface of the ceramic material.

Figure 2B:
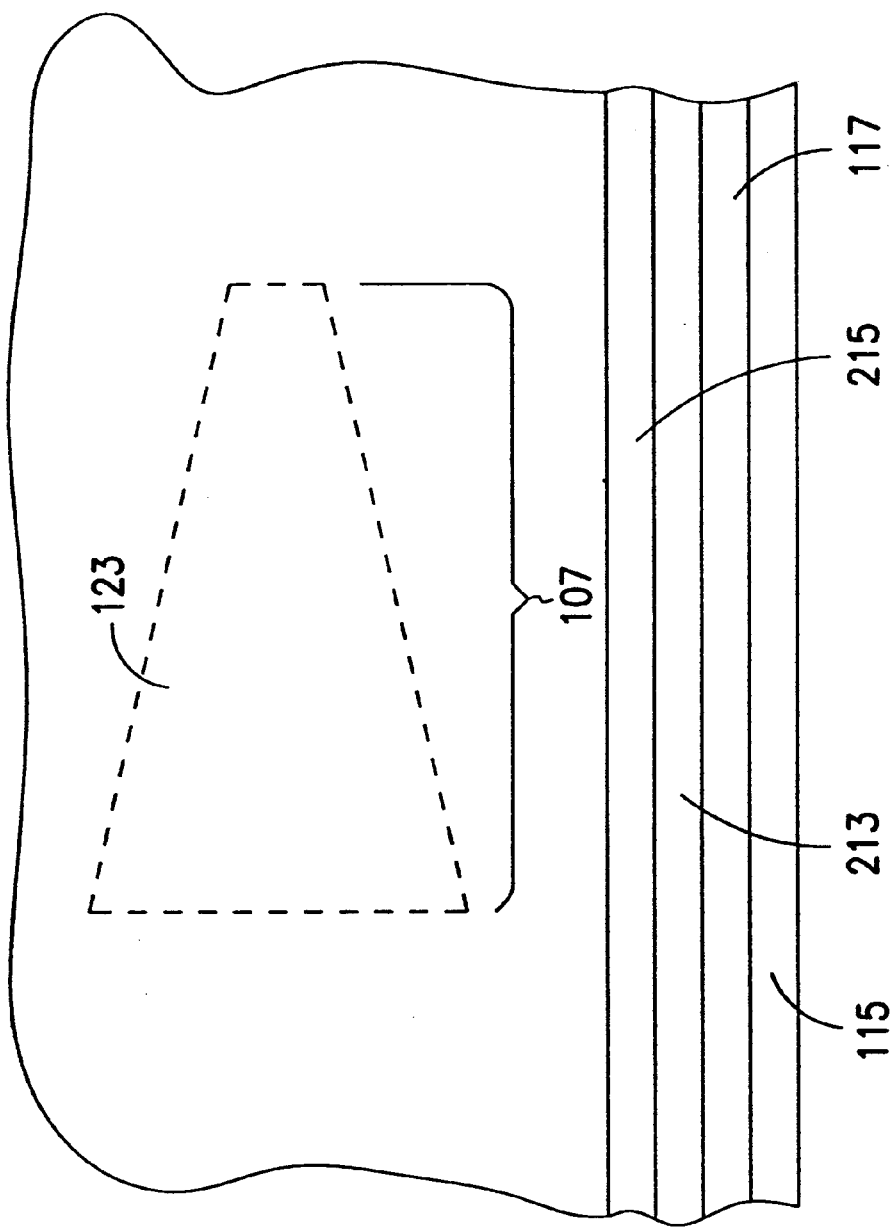
FIG. 2B is an illustration of an alternate embodiment of the tapered transmission line shown in FIG. 1A.

FIG. 2B is an illustration of an alternate embodiment of the tapered transmission line 107 shown in FIG. 1A. The tapered transmission line 107 illustrated in FIG. 2B is sometimes referred to as a stripline. The tapered transmission line 107 includes the conductive layer 115 (shown in FIG. 1B and described above), the dielectric layer 117 (shown in FIG. 1B and described above), the conductor 123 (shown in FIG. 1B and described above), a second dielectric layer 213, and a second conductive layer 215. The second dielectric layer 213 is not limited to being fabricated from a particular dielectric material. Any dielectric material suitable for use in connection with the fabrication of microstrip or stripline interconnects is suitable for use in the fabrication of the second dielectric layer 117. Exemplary dielectrics suitable for use in the fabrication of the dielectric layer 213 include plastics, glasses, ceramics, semiconductors, and epoxies. The second conductive layer 215 is preferably fabricated from a conductive material, such as a metal. Exemplary metals suitable use in the fabrication of the second conductive layer 215 include copper, gold, silver, aluminum, or an alloy of copper, gold, silver, or aluminum.

Figure 3:
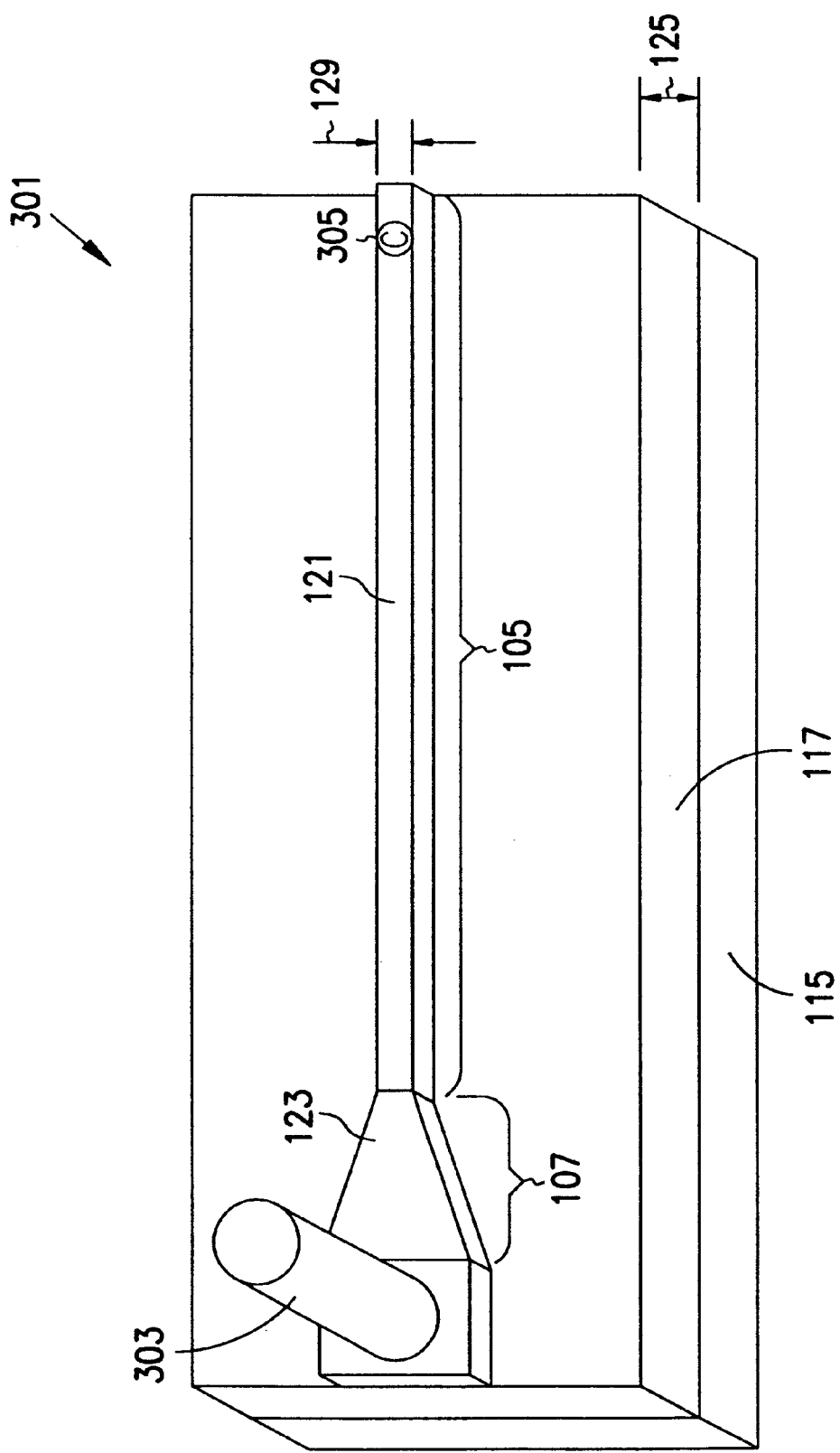
FIG. 3 is a perspective view of an alternate embodiment of a signal transmission unit including a connector coupled to a transmission line in accordance with the teachings of the present invention.

FIG. 3 is a perspective view of an alternate embodiment of a signal transmission unit 301 according to the teachings of the present invention. The signal transmission unit 301 includes a connector 303, the tapered transmission line 107, and the second transmission line 105. The tapered transmission line 107 couples the connector 303 to the second transmission line 105. The tapered transmission line 107 and the second transmission line 105 provide a path for conveying electromagnetic field from the connector 303 to the point C 305 or from the point C 305 to the connector 303. The taper of conductor 123 can also be reversed where the second transmission line 105 is of a lower impedance and the connector 303 is of a higher impedance.

The transmission lines 107 and 105 include a conductive layer 115, a dielectric layer 117, and conductors 123 and 121 separated from the conductive layer 115 by the dielectric layer 117. The dielectric layer 117 has a thickness 125. The conductor 121 has a width 129.

The connector 303 is mounted on the dielectric layer 117. The conductors 123 and 121 are formed on the dielectric layer 117. The conductor 123 couples the connector 303 to the conductor 121. The tapered transmission line 107 electrically couples the connector 303 to the second transmission line 105. In an alternate embodiment, the conductors 123 and 121 can function as a stripline by being sandwiched between two power planes.

The connector 303 typically couples a transmission line (not shown) to the tapered transmission line 107. The signal transmission unit 301 is not limited to use in connection with a particular type of connector. Any connector suitable for use in coupling transmission lines together is suitable for use in connection with the signal transmission unit 301. In general, the characteristic impedance of the connector 303 is selected to be about equal to the characteristic impedance of the transmission line (not shown) coupled to the connector 303. However, the characteristic impedance of the connector 303 is generally not equal to the characteristic impedance of the second transmission line 105. The tapered transmission line 107 transforms the impedance seen by a signal traveling between the connector 303 and the point C 305 from the characteristic impedance of the second transmission line 105 to the characteristic impedance of the connector 303.

Figure 4:
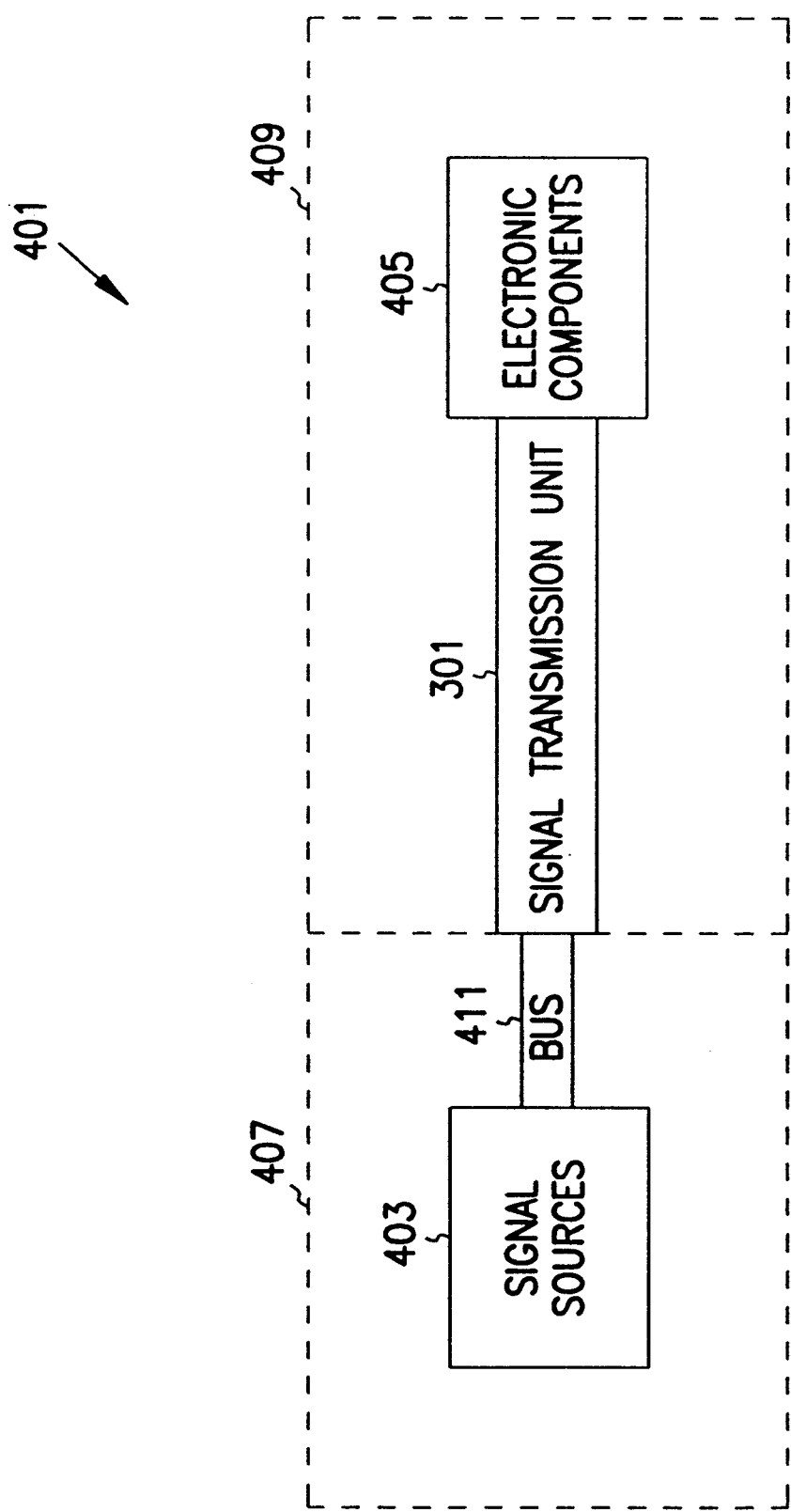
FIG. 4 is a block diagram of a system for coupling signal sources to electronic components in accordance with the teachings of the present invention.

FIG. 4 is a block diagram of a an electronic system 401 including one or more signal sources 403 coupled to one or more electronic components 405 in accordance with the teachings of the present invention. The electronic system 401 includes a first substrate 407 and a second substrate 409. The first substrate 407 includes the one or more signal sources 403 coupled to a bus 411. The second substrate 409 includes one or more signal transmission units 301 (shown in FIG. 3) coupled to the one or more electronic components 405. The one or more signal transmission units 301 couple the signal sources 403 through bus 411 to the electronic components 405.

The first substrate 407 is not limited to a particular type of substrate. In one embodiment, the first substrate 407 is a printed circuit board including surface mounted electronic components. In an alternate embodiment, the first substrate 407 is a ceramic substrate including one or more dice. In another alternate embodiment, the first substrate 407 is a semiconductor including one or more transistors. In still another alternate embodiment, the first substrate 407 is a mezzanine substrate including one or more integrated circuits. A mezzanine substrate as used herein is defined as a substrate that is capable of being electrically coupled to another substrate.

Each of the one or more signal sources 403 is capable of generating an electronic signal. The one or more signal sources 403 are not limited to a particular type of signal source. In one embodiment, the one or more signal sources 403 include a processor, such as a microprocessor, a digital signal processor, a complex instruction set computing system, or a reduced instruction set computing system. In an alternate embodiment, the one or more signal sources 403 include an application specific integrated circuit.

The bus 411 provides a path for routing signals generated by the one or more signal sources 403 between the one or more signal sources 403 and second substrate 409. In one embodiment, the bus 411 includes a plurality of transmission lines, such as the first transmission line 103 (shown in FIG. 1). By providing a path having a plurality of transmission lines for routing signals on the first substrate 407, the bus 411 provides a potentially high bandwidth path for communicating with the electronic components 405 located on the second substrate 409.

The second substrate 409 is not limited to a particular type of substrate. In one embodiment, the second substrate 409 is a printed circuit board. In an alternate embodiment, the second substrate 409 is a ceramic substrate. In another alternate embodiment, the second substrate 409 is a semiconductor.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A signal transmission unit comprising:
   a first transmission line comprising a microstrip transmission line;
   a second transmission line; and
   a tapered microstrip transmission line having a width and a length in which the width changes along the length according to functions, the tapered microstrip transmission line to couple the first transmission line to the second transmission line, wherein the functions comprise a linear function and a hyperbolic function.

2. The signal transmission unit of claim 1, wherein the second transmission line comprises a stripline transmission line.

3. The signal transmission unit of claim 1, wherein the second transmission line comprises a microstrip transmission line.

4. The signal transmission unit of claim 1, wherein the microstrip transmission line includes a conductive layer comprising gold.

5. The signal transmission unit of claim 1, wherein the microstrip transmission line includes a dielectric layer comprising an epoxy.

6. A signal transmission unit comprising:
   a first transmission line;
   a second transmission line; and
   a tapered transmission line having a width and a length in which the width changes along the length according to two or more functions, the tapered transmission line to couple the first transmission line to the second transmission line, wherein the tapered transmission line comprises:
   a conductive layer;
   a dielectric layer formed above the conductive layer, the dielectric layer having a surface; and
   a tapered conductor formed on the surface, wherein the tapered conductor has a width and a length and the width changes along the length according to at least two different functions, and at least one of the at least two different functions comprises a hyperbolic function.

7. The signal transmission unit of claim 6, wherein the first transmission line comprises a microstrip transmission line.

8. The signal transmission unit of claim 6, wherein the second transmission line comprises a stripline transmission line.

9. The signal transmission unit of claim 6, wherein the tapered transmission line comprises a microstrip transmission line.

10. The signal transmission unit of claim 6, wherein the conductive layer comprises copper.

11. The signal transmission unit of claim 6, wherein the dielectric layer comprises a ceramic.

12. An electronic system comprising:
    a first substrate having one or more signal sources coupled to a bus; and
    a second substrate comprising a ceramic substrate including one or more dice, the second substrate having a signal transmission unit coupled to one or more electronic components and the bus, and the signal transmission unit including a tapered transmission line attached to the bus, wherein the first substrate comprises a mezzanine substrate.

13. The electronic system of claim 12, wherein at least one of the one or more signal sources comprise a processor.

14. The electronic system of claim 12, wherein the bus includes a plurality of transmission lines.

15. The electronic system of claim 12, wherein the tapered transmission line comprises a microstrip transmission line.

16. The electronic system of claim 12, wherein the mezzanine substrate comprises a semiconductor.

* * * * *